United States Patent [19]

Scherer et al.

[11] Patent Number: 4,488,956
[45] Date of Patent: Dec. 18, 1984

[54] HIGH-POWER CATHODE SYSTEM FOR PRODUCING MULTILAYERS

[75] Inventors: Michael Scherer, Rodenbach; Karl-Heinz Kubacha, Bruchköbel, both of Fed. Rep. of Germany

[73] Assignees: Leybold-Heraeus GmbH, Cologne; Glyco-Metal Werke, Weisbaden, both of Fed. Rep. of Germany

[21] Appl. No.: 564,300

[22] Filed: Dec. 22, 1983

[30] Foreign Application Priority Data

Dec. 24, 1982 [DE] Fed. Rep. of Germany ....... 3248121

[51] Int. Cl.³ ............................................. C23C 15/00
[52] U.S. Cl. .................................. 204/298; 204/192 R
[58] Field of Search .......................................... 204/298

[56] References Cited

U.S. PATENT DOCUMENTS

| 3,985,635 | 10/1976 | Adam et al. | 204/298 |
| 4,169,031 | 9/1979 | Brors | 204/298 |
| 4,170,541 | 10/1979 | Lamont | 204/298 |
| 4,279,216 | 7/1981 | Buhl | 204/298 |
| 4,397,724 | 8/1983 | Moran | 204/298 |
| 4,434,038 | 2/1984 | Morrison | 204/298 |

Primary Examiner—Arthur P. Demers
Attorney, Agent, or Firm—Felfe & Lynch

[57] ABSTRACT

High-power cathode system for producing multilayers of different target materials on a substrate has at least two different target materials which abut one another at a boundary line in the field of a magnetic field generator thereof. The substrate is transported for coating across the boundary line, preferably perpendicularly.

8 Claims, 1 Drawing Figure

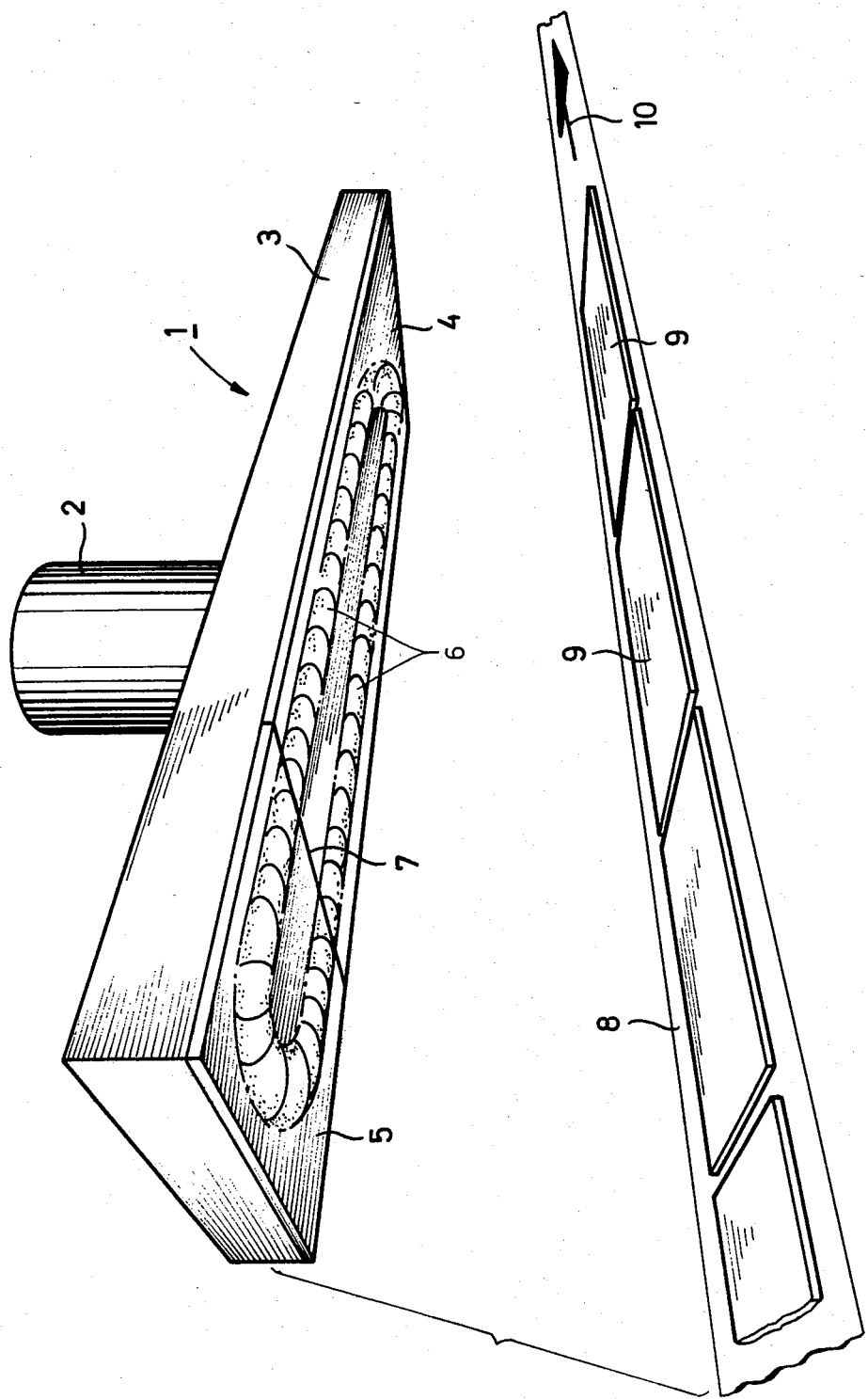

HIGH-POWER CATHODE SYSTEM FOR PRODUCING MULTILAYERS

BACKGROUND OF THE INVENTION

The invention relates to a high-power cathode system for producing layers of different target materials on a substrate.

High-power cathode systems with planar or convex target plates are known. They are also called "magnetrons". A magnetron is described, for example, in DE-OS No. 3,047,113.

In a magnetron, at least one magnetic field generator which can be in the form of an electromagnet or a grouping of permanent magnets is behind the target plate. The individual poles or pole shoes of the magnetic field generator are disposed one inside the other in a closed figure such as a ring, rectangle or oval so that the poles of the one polarity are on the outside and those of the other polarity are on the inside of the figure. This results in a three-dimensional tunnel of arcuate lines of magnetic force arranged about the figure and having their roots in the target surface. The result is a concentration of the glow discharge form the cathode system target in an area inside the tunnel and, consequently, a considerable increase in the probability of the collision of electrons and ions therein. This increases the rate of the sputtering of the target material, and hence the rate of condensation on an adjacent substrate, for example by a factor of ten to twenty. For this reason, such magnetrons are also referred to as high-power cathodes.

Layers of different target materials have been made by arranging a corresponding number of magnetrons, each consisting of a magnetron base body and a magnetic field generator, but having a target plate of a different material, in a row, one after another, and moving a substrate successively under all of the magnetrons. In this manner, a succession of layers of the individual target materials has been formed. One especially well-known application is the production of infrared-reflecting window glass in which the first layer is in adhesivizer, the second layer, the actual infrared-reflecting layer, and the third layer, a protection and interference layer. These layers were, however, strictly, separate from one another. The individual layers had no zones of transition therebetween, so that the strength of adhesion between the individual layers was not sufficient for a number of applications in which layers are subjected to great mechanical stress.

It is also known through DE-OS No. 2,243,708 to construct a magnetron system with a target in the form of a circular plate and a circular ring surrounding the latter at a distance therefrom, or from two semicircular disks with a gap between them. A single tunnel of lines of magnetic force extends over both of these target or cathode parts. The cathode parts, however, are also supplied with high-frequency alternating current in a way which constantly gives them different potentials relative to one another so that the gap between them is essential for insulation. Furthermore, in the patent publication, the two cathode parts consist of the same material, so that neither a disclosure nor a suggestion exists of producing layers with a zone of transition therebetween.

SUMMARY OF THE INVENTION

It is therefore the object of the invention to provide a high-power cathode system with which layers merging gradually with one another, or multilayers, can be produced. What is involved is the production of a so-called "tooth" between the individual layers to increase their strength of adhesion. This has been impossible with the magnetrons known heretofore because the magnetic fields and the target plates thereof were separate from one another.

This and other objects are achieved in accordance with the invention in a high-power cathode system as initially described by abutting at least two different target materials at least at one boundary line within the field of a magnetic field generator which forms at least one fully-closed discharge figure thereover and transporting a substrate for coating thereby in a direction of transport which crosses the boundary line, preferably perpendicularly.

Due to the measures taken in accordance with the invention, the tunnel formed of magnetic lines of force extends along at least two different target materials which directly abut one another. On account of this, the glow discharge cannot escape therebetween, so that a high sputtering rate is sustained. Since the atomized particles of the target material move away from the target surface not just in the perpendicular direction, but also at random angles thereto due to a scatter effect, a thorough mixing of the particles of the individual target materials takes place adjacent the boundary line. Then, because the substrate is transported across this boundary line, a zone of transition with a continuous gradient forms between the different target materials on the substrate in which the individual target materials intermingle. This considerably increases the strength of adhesion thereof.

It is especially advantageous, in accordance with a further feature of the invention, to form the target of at least two plane-parallel plates of rectangular (including square) shape for the plates to abut one another directly within at least one discharge space.

An example of an embodiment of the invention will be explained hereinbelow in conjunction with the single drawing.

The drawing shows a high-power cathode system 1 which is formed by a feed-through insulator 2 serving as a shank which is fastened at the top to a vacuum chamber (not shown). The high-power cathode system 1 has a cathode body 3 which is constructed in a known manner in the form of an oblong trough in which the magnetic field generator described above is situated.

Also, a cooling liquid flows through the cathode body in order to keep the working temperature low.

On the bottom, planar surface of the cathode body 3, two different target materials 4 and 5 in the form of two plane-parallel plates of rectangular shape are fastened abuttingly such that they are in good heat-conducting contact with the cathode body 3.

The construction of the magnetic field generator, which is known in itself and described above, leads to the production of a discharge space 6 extending along both of the target materials 4 and 5. Some of the magnetic fields of force for this are represented as arcs. Their course is determined by the position of the poles or pole shoes behind the target materials. The phantom line joining together all of the outer roots of the lines of force indicates the position of the poles or pole shoes of one polarity, and the line joining all of the inside roots indicates the position of the other poles or pole shoes. It is clear that the lines of force shown represent only symbolically an infinite number of lines of force, and that the roots of all lines of force lie not only on the two phantom lines shown, but are distributed over the entire target surface that is visible in the drawing. In the operation of the apparatus, however, due to the concentrated-discharge space 6, a locally-intensified erosion of the target materials results, which causes the formation of a channel-like cavity at the location of the indicated lines of force. the two target materials 4 and 5 thus abut one another directly at a common boundary line 7 across the discharge space 6.

Underneath the high-power cathode system 1 there is a transport device 8 for carrying substrates 9. The transport device can be in the form of an endless conveyor as shown, or of a roller train, on which the substrates are carried singly or in groups, for example on plate-like carriers. The direction of transport of the transport device 8 is indicated by an arrow 10. This direction perpendicularly crosses the boundary line 7 extending over the entire width of the cathode body 3, so that the individual substrates pass successively into the sputtering area of the target materials 4 and 5 for layer coating thereby.

It is to be understood that the ratio of the individual layer thicknesses corresponds approximately to the ratio of the length of the target materials 4 and 5 in the direction of transport, assuming that the rate of sputtering of both of the target materials is approximately equal. Any difference in the sputtering rates can be compensated by a corresponding shift of the boundary line 7. In any case, a transitional or mixing stratum then forms between the two target-material layers when the substrates 9 pass below the boundary line 7.

It is of course also possible to use more than two different target matrials, as for example three or four different target materials, as long as the multiple boundary lines between the individual target materials are all situated within one magnetron discharge space. It is also possible to provide more than one magnetic field generator or more than one discharge chamber within the entire cathode body, in which case care must be taken only to see that the discharge spaces are not interrupted in the vicinity of the boundary lines.

It will be understood that the specification and examples are illustrative but not limitative of the present invention and that other embodiments within the spirit and scope of the invention will suggest themselves to those skilled in the art.

What is claimed is:

1. A high-power cathode system for producing layers of different materials on a substrate, comprising:

a high power cathode device having a target of at least two different materials, each two materials abutting each other at a boundary line therebetween, and means, including a discharge-concentrating, closed-figure magnetic field generator, for producing a glow discharge of the target materials at least across the boundary line therebetween, whereby, because the target materials abut, the magnetically-concentrated glow discharge cannot escape through the target; and means for transporting a substrate in layer-coating relation to the glow discharge of the target materials of the high power cathode device in a direction which crosses each boundary line thereof, whereby, as the substrate is transported across each boundary line, a gradual transition of the target materials coated thereon occurs for adhering the layers of the target materials coated therebefore and thereafter.

2. The system of claim 1, wherein the direction of transport crosses each boundary line perpendicularly.

3. The system of claim 1, wherein the target comprises plane-parallel plates of the respective target materials, each plate being rectangular in plan.

4. The system of claim 2, wherein the target comprises plane-parallel plates of the respective target materials, each plate being rectangular in plan.

5. The system of claim 1, wherein the magnetic field generator produces a discharge chamber of locally intensified erosion of the target and the boundary line is therewithin.

6. The system of claim 2, wherein the magnetic field generator produces a discharge chamber of locally intensified erosion of the target and the boundary line is therewithin.

7. The system of claim 3, wherein the magnetic field generator produces a discharge chamber of locally intensified erosion of the target and the boundary line is therewithin.

8. The system of claim 4, wherein the magnetic field generator produces a discharge chamber of locally intensified erosion of the target and the boundary line is therewithin.

* * * * *